(12) United States Patent
Franca-Neto et al.

(10) Patent No.: US 8,649,215 B2
(45) Date of Patent: *Feb. 11, 2014

(54) DATA MANAGEMENT IN FLASH MEMORY USING PROBABILITY OF CHARGE DISTURBANCES

(75) Inventors: Luiz M. Franca-Neto, Sunnyvale, CA (US); Richard Leo Galbraith, Rochester, MN (US); Travis Roger Oenning, Rochester, MN (US)

(73) Assignee: HGST Netherlands B.V., Amsterdam (NL)

( * ) Notice: Subject to any disclaimer, the term of this patent is extended or adjusted under 35 U.S.C. 154(b) by 410 days.

This patent is subject to a terminal disclaimer.

(21) Appl. No.: 12/930,017

(22) Filed: Dec. 22, 2010

(65) Prior Publication Data

US 2012/0166897 A1 Jun. 28, 2012

(51) Int. Cl.
*G11C 16/34* (2006.01)
*G11C 16/06* (2006.01)
*G11C 29/00* (2006.01)
*G11C 29/44* (2006.01)

(52) U.S. Cl.
USPC ................ 365/185.02; 365/185.09; 711/103; 714/721; 714/723

(58) Field of Classification Search
USPC ................ 365/185.02, 185.09; 714/718–723; 711/103
See application file for complete search history.

(56) References Cited

U.S. PATENT DOCUMENTS

| | | | |
|---|---|---|---|
| 5,715,193 A | 2/1998 | Norman | |
| 6,005,810 A * | 12/1999 | Wu | 365/185.33 |
| 6,172,910 B1 | 1/2001 | Lee | |
| RE41,485 E | 8/2010 | Tanaka et al. | |
| 7,782,674 B2 | 8/2010 | Roohparvar et al. | |
| 2006/0028875 A1* | 2/2006 | Avraham et al. | 365/185.24 |
| 2008/0192544 A1 | 8/2008 | Berman et al. | |
| 2008/0198650 A1* | 8/2008 | Shalvi et al. | 365/185.02 |
| 2008/0307270 A1 | 12/2008 | Li | |
| 2009/0116283 A1 | 5/2009 | Ha et al. | |
| 2010/0061148 A1 | 3/2010 | Komatsu | |
| 2010/0162084 A1 | 6/2010 | Coulson et al. | |
| 2010/0214847 A1 | 8/2010 | Nishihara et al. | |
| 2010/0218068 A1 | 8/2010 | Li et al. | |
| 2010/0309726 A1 | 12/2010 | Yang | |
| 2012/0075930 A1* | 3/2012 | Patapoutian et al. | 365/185.03 |
| 2012/0166707 A1* | 6/2012 | Franca-Neto et al. | 711/103 |

OTHER PUBLICATIONS

B. Ricco, et al., "Nonvolatile Multilevel Memories for Digital Applications," Proceedings of the IEEE, vol. 86, No. 12, Dec. 1998; pp. 2399-2421.

(Continued)

*Primary Examiner* — J. H. Hur
(74) *Attorney, Agent, or Firm* — G. Marlin Knight

(57) ABSTRACT

A Flash memory system and a method for data management using the system's sensitivity to charge-disturbing operations and the history of charge-disturbing operations executed by the system are described. In an embodiment of the invention, the sensitivity to charge-disturbing operations is embodied in a disturb-strength matrix in which selected operations have an associated numerical value that is an estimate of the relative strength of that operation to cause disturbances in charge that result in data errors. The disturb-strength matrix can also include the direction of the error which indicates either a gain or loss of charge. The disturb-strength matrix can be determined by the device conducting a self-test in which charge-disturb errors are provoked by executing a selected operation until a detectable error occurs. In alternative embodiments the disturb-strength matrix is determined by testing selected units from a homogeneous population.

2 Claims, 15 Drawing Sheets

(56) References Cited

OTHER PUBLICATIONS

A. Chimenon and P. Olivo, "Erratic Erase in Rash Memories—Part I: Basic Experimental and Statistical Characterization," IEEE Trans. Elect. Dev., vol. 50, No. 4, Apr. 2003; pp. 1009-1014.

T. Tanzawa et al., "A Compact On-Chip ECC for Low Cost Flash Memory," IEEE J. Solid-State Circ., vol. 32, No. 5, May 1997, pp. 662-669.

S. Yamada et al:, "Degradation Mechanism of Flash EEPROM Programming After Program/Erase Cycles," IEEE IEDM, 1993, vol. 38, Issue 2, Feb. 27, 1998, pp. 185-188.

Tanaka, et al.; "A quick intelligent page-programming architecture and a shielded bitline sensing method for 3 V-only NAND flash memory", IEEE Journal of Solid-State Circuits, vol. 29 Issue:11, Nov. 1994; pp. 1366-1373.

I.E. Opris, "Rail-to-Rail-Multiple-Input Min/Max Circuit," IEEE Trans. Circ. & Systems II, vol. 45, No. 1, Jan. 1998, pp. 137-140.

Douglas Sheldon & Micheal Freie, "Disturb Testing in Flash Memories," NASA WBS: 939904.01.11-10 JPL Project No. 102197; Task No. 1.23.6; 2008. Accessed Nov. 10, 2010 at Internet address http://trs-new.jpl.nasa.gov/dspace/bitstream/2014/40761/1/08-07.pdf.

* cited by examiner

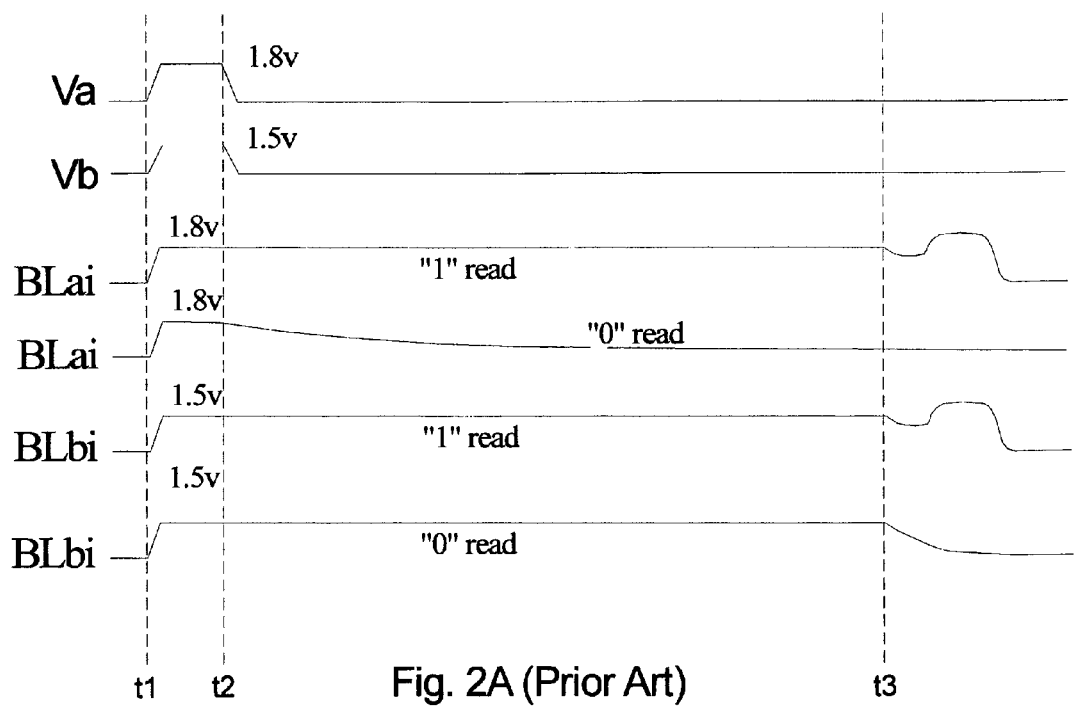

DATA MANAGEMENT IN FLASH MEMORY USING PROBABILITY OF CHARGE DISTURBANCES

RELATED APPLICATIONS

A related application by the inventors of the present application, which is commonly assigned application, is titled "Early Detection of Degradation in NOR Flash Memory." A serial number will be provided when available.

A related application by the inventors of the present application, which is commonly assigned application, is titled "Early Detection of Degradation in NAND Flash Memory." A serial number will be provided when available.

FIELD OF THE INVENTION

The present disclosure relates generally to non-volatile semiconductor memory, and more particularly to error detection and correction techniques for Flash memory.

BACKGROUND

EEPROM and Flash memories (NOR and NAND) use a floating gate (FG) to store electrical charges to represent information. These memory devices suffer from degradation mechanisms after program/erase cycles that place limits on the number of erase/program operations a device can endure. Multi-Level Cell (MLC) Flash devices typically have significantly lower program/erase cycles endurance than Single-Level Cell (SLC) devices.

Various program and erase operations can lead to gain or loss of charge in neighboring cells, which is called a "disturb." A disturb error occurs when the initial/programmed state of a cell changes as a result of programming or reading operations executed on nearby cells. Disturb errors are soft errors. A "read disturb" occurs when the amount of charge in a memory cell is altered by reading another cell, physically close to or sharing control lines with the disturbed cell. A single read disturb event may not produce enough change in charge content to effect an error, but cumulative read disturbs may eventually do so. The cumulative effect of read disturbs are reset by an erase operation. The specific matrix architecture of NAND Flash leads to more "read disturb" errors than NOR Flash. Program disturb errors result in a bit being set to the wrong value during page-programming. The bit error can happen on the page being programmed, but it can also occur on a different page in the block.

In U.S. Pat. No. 5,715,193 (Feb. 3, 1998), Robert Norman describes a method for monitoring the disturb effect on memory cell blocks in which each time an erase block is erased, the controller updates a table for the decode block which contains the erased block by adding a unit of disturb to the count for each other erase block in the decode block and resetting the count for the erased block to zero. Norman also states that preferably, the controller performs a refresh operation on each erase block whose disturb count reaches a predetermined maximum value. During the refresh operation, any necessary recovery procedures are performed to restore the proper charge to the floating gate of each cell of the erase block, thus preventing any erroneous reads of data that would otherwise occur (due to the disturb effect) absent performance of the refresh operation.

Multi-Level Cell (MLC) Flash devices can store multiple bits per memory cell by charging the floating gate of a transistor to different selected threshold voltage ($V_T$) levels and, thereby, use the analog characteristic of the cell in mapping a bit pattern to a specific voltage level. In the case of NAND Flash, the $V_T$ of MLC devices are, conceptually, read by sequentially applying selected read voltage ($V_{READ}$) levels to the floating gates of the cells. Typically, the voltage ranges are selected with a guardband between each range to help ensure that the normal $V_T$ distributions do not overlap.

In NOR Flash, cells are connected in parallel to the bitlines, which allows cells to be individually read and programmed with all other transistors in series at known state. Thus, in NOR Flash, the transistors in series with the memory cell being queried are transistors associated with addressing functions only.

Published U.S. patent application 20080307270 by Tieniu Li (Dec. 11, 2008) describes a scheme implemented on a host device for detection of emerging bad blocks in a NAND memory that includes keeping at least a partial history of errors during read operations.

Published U.S. patent application 20100214847 by Nishihara, et al. describes a NAND Flash memory system that is said to reduce variations in the read disturb characteristic from chip to chip by that including a peripheral circuit that includes means for storing and retrieving a corrected read voltage for use by a memory controller. The memory controller performs data input/output control and data management on the Flash memory, adds error correction codes (ECC) upon writing, and analyzes the error correction codes upon reading.

Solid-state drives (SSDs) are data storage devices that are typically designed to be functional replacements for traditional hard disk drives (HDDs), but SSDs use solid-state memory to store data. The term SSD will be used herein only to refer to Flash memory based devices. SSDs generally use the same command interface as hard disk drives to allow SSDs to be used in place of HDDs in many applications without requiring software modifications. Hybrid devices that include both HDD and SSD features are also possible.

Given that degradation of memory content is progressive and unavoidable with time and number of program/erase cycles, there is a need to develop efficient error correcting codes that can take advantage of fundamental physics and operational details of Flash memory chips. These efficient error correcting codes need to make use of soft information retrievable at reading time without penalty to Flash memory readout performance. The present invention described below is related to inventions in other applications described in the Related Applications section above which will be generally referred to as Early Degradation Detection (EDD) systems for Flash memories. The present invention can stand alone or be complementary to EDD systems to further increase reliability and operational life of Flash memories.

SUMMARY OF THE INVENTION

Embodiments of the invention include a Flash memory device such as a solid state drive (SSD) and a method for data management using probabilities based on the system's sensitivity to charge disturbing operations and the history of charge disturbing operations executed by the system. In an embodiment of the invention, the sensitivity to charge-disturbing operations is embodied in a disturb-strength matrix in which selected operations have an associated numerical value that is an estimate of the relative strength of that operation to cause disturbances in charge that can result in data errors. The disturb-strength matrix can also include the direction of the error which indicates either a gain or loss of charge. In one embodiment the disturb-strength matrix is determined by the device conducting a self-test in which charge-disturb errors are provoked by executing a selected operation until a detectable error occurs. All operations that can potentially cause charge disturbances can be included in the testing. In embodiments of the invention the disturb-strength of an operation will be determined by the number of operations required to produce a detectable disturbance (bit change) caused by a change in the charge content of a Flash cell. The higher the number of operations required to cause an error, the lower the disturb-strength.

In alternative embodiments the disturb-strength matrix is determined by testing selected units from a homogeneous population. Use of a relatively small set of selected sample devices allows the testing to be destructive, i.e. to include performing operations that shorten or exhaust the useful life of the devices.

In an alternative embodiment, the disturb-strengths are estimated by counting the numbers of operations that can be executed before a detectable change occurs in the dispersion in time-to-completion (TTC) values in a read operation. The TTC values are used as a proxy for dispersion of the threshold voltages ($V_T$'s) in the memory cells queried in this read operation.

The disturb-strength test should be performed as part of the fabrication process at the factory (either on every device or selected samples) and the disturb-strength matrix will then be used as part of the data management system in every device according to the invention. The disturb-strength matrix is used in conjunction with a running historical record (operation history) of the charge-disturbing operations previously executed on the SSD system to determine when to perform prophylactic actions to prevent loss of data. It is also possible to use the disturb-strength matrix and the operation history to assign probabilities that a data point value read from memory is the result accumulated charge disturbances. Knowledge that a data point value has a sufficiently high probability of having been disturbed in a particular direction, allows error correction to be performed in real-time as part of the SSD's normal readout operation.

BRIEF DESCRIPTION OF THE FIGURES

FIG. 2A is an illustration of selected timing curves for a read operation for the prior art NAND Flash multilevel memory cell structure of FIG. 1.

FIG. 7A is a conceptual schematic, and FIG. 7B shows an improvement with current mirrors and several sense amps in parallel, each with its own reference voltage, switching at the same time.

DETAILED DESCRIPTION OF THE INVENTION

Figure 14:
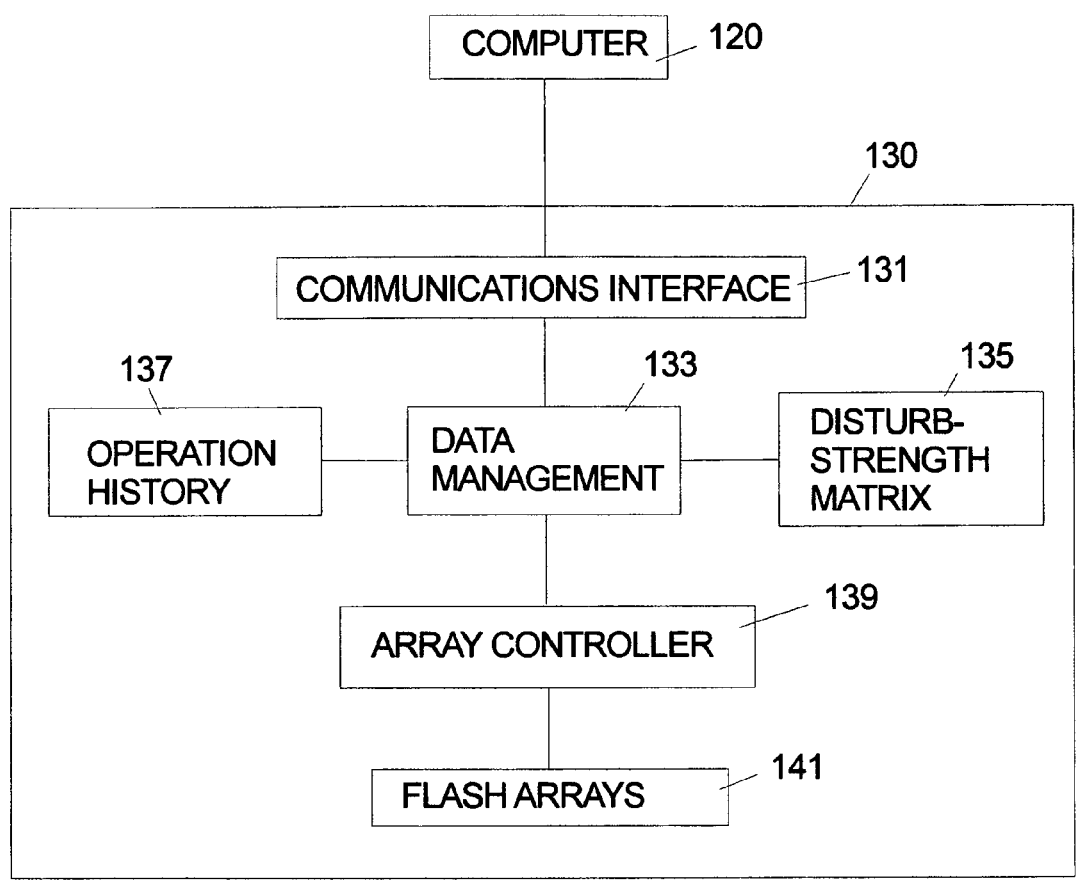
FIG. 14 is a block diagram illustrating selected components in an SSD according to an embodiment of the invention.

FIG. 14 is a block diagram illustrating selected components in an SSD 130 according to an embodiment of the invention. It's provide only as illustration. The skilled in the art will recognize that some of the functions described can be relocated to the host without departing from the spirit of the invention. The SSD includes Communications Interface 131 which handles two communications between the SSD and a host device such as computer 120. The SSD includes Data Management unit 133 which manages the flow of data to and from the Array Controller 139 which in turn controls the flow of data to and from the Flash Arrays 141, which can be NAND or NOR type devices. The Data Management unit 133 in this embodiment will include a standard microprocessor (not shown) with associated nonvolatile memory in which a firmware program is stored. The firmware program is executed by microprocessor to implement the data management process steps described below. The Data Management unit 133 uses the Disturb-Strength Matrix 135, which is described below, along with the running Operation History 137 to determine when to execute prophylactic data management activities. In various embodiments the Data Management unit 133 maintains the Operation History 137 by recording each significant operation executed on the Flash Arrays 141. In some embodiments the Data Management unit 133 is supplied the Disturb-Strength Matrix 135 as read-only data, because the Disturb-Strength testing was performed on other selected sample devices. However, in some embodiments the Data Management unit 133 creates the Disturb-Strength Matrix 135 by running a self-test.

The invention includes embodiments that use NAND Flash Arrays 141 and embodiments that use NOR Flash Arrays 141. The NAND and NOR Flash memories, which include an Early Degradation Detection (EDD) system according to related inventions, that are included in embodiments of the invention will be described below.

NAND Flash Embodiment with Early Degradation Detection

Figure 1:
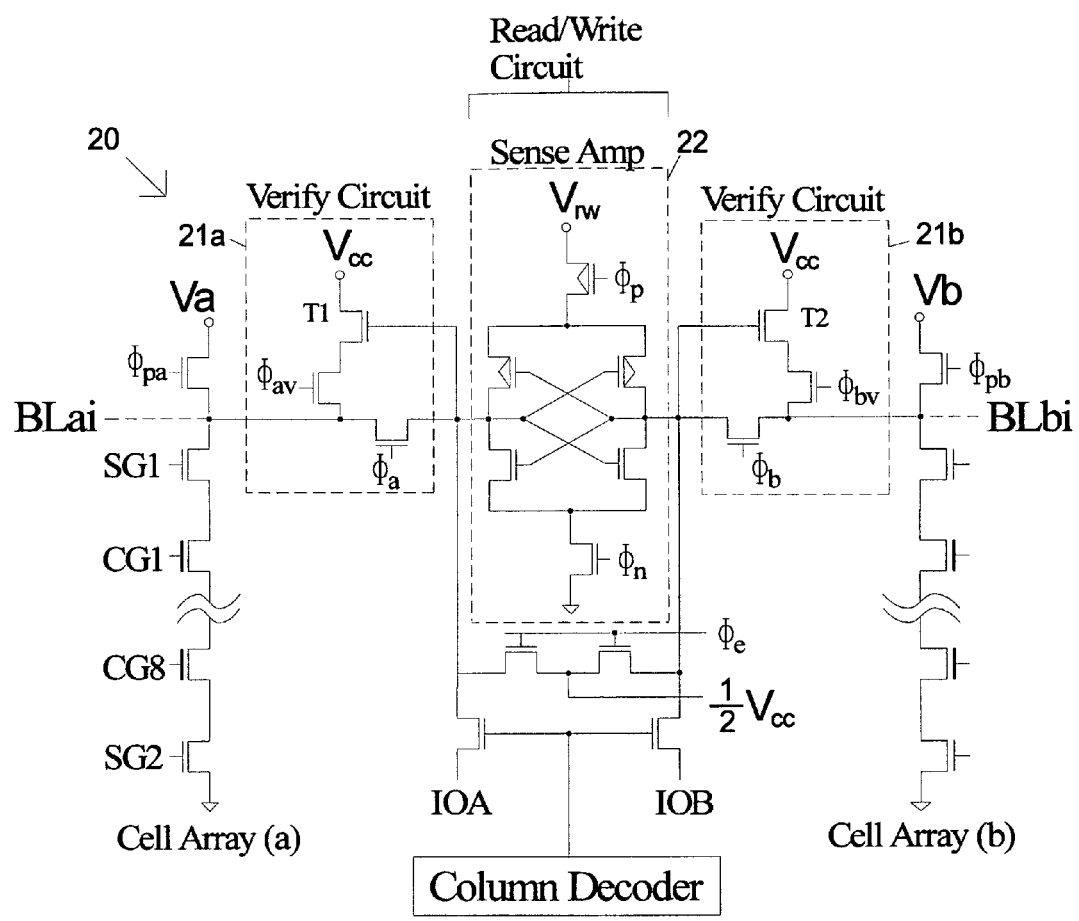
FIG. 1 is an illustration of a prior art NAND Flash multilevel memory cell structure.

A prior art NAND Flash applicable to single and multilevel memory cell structure 20 is illustrated in FIG. 1. Note that other memory cells, with any valid programmed $V_T$ levels, are placed in series with a NAND Flash memory cell being queried. (Note: This is not the case for NOR Flash memory.) The NAND-structured cells are divided into two cell arrays with cell array (a) shown as the left-hand column of transistors and cell array (b) as the right-hand column. The cell structure 20 includes by bit-by-bit verify (BV) circuits 21a, 21b which are connected to each of the two bitlines BLai, BLbi. The two bitlines and BV circuits share a common READWRITE (R/W) circuit similar to an open-bit-line architecture of a DRAM. The R/W circuit acts as a flip-flop type differential sense amplifier 22 in the read operation and as a data latch circuit in the program/write operation.

Selected timing curves for a read operation of the structure of FIG. 1 are shown in FIG. 2A with selected points in time t1, t2 and t3. For simplicity, all timing diagrams and discussions assume perfectly matched readout circuits for the parallel reading of all cells in a page. Mismatches in those circuits can be accounted for by simple calibration procedures. For instance, a reference readout using a specific set of memory cells with known content can be used to correct sense amps mismatches in later readouts of cells in the memory array.

Figure 2B:
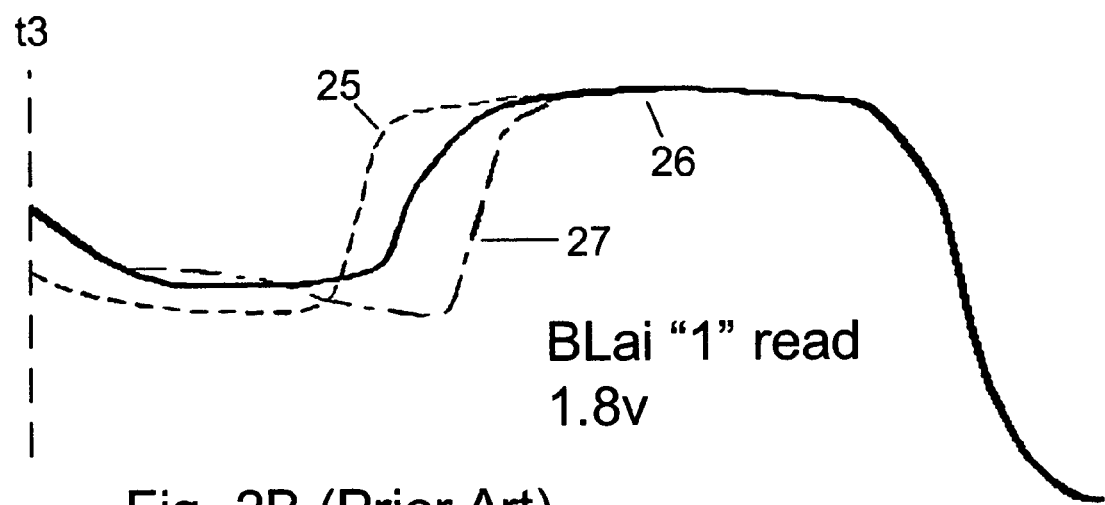
FIG. 2B is an illustration of selected timing curves for a read operation for a set of prior art NAND Flash memory cell structures of FIG. 1 showing a possible range of timing curves for the set.

The sense amplifier 22, which is a comparator, typically uses a regenerative loop to develop a small separation of input lines after the pass gates from bitlines BLai and BLbi in FIG. 1 into fully developed output voltage levels. The circuit in FIG. 1 and the curves in FIG. 2A are fairly representative of a NAND Flash readout. FIG. 2B is an illustration of a selected portion following t3 of the BLai "1" read for 1.8 v a set of prior art NAND Flash memory cell structures of FIG. 1 showing the typical timing curve 26 and an example of a possible range of timing curves for a set of cells bounded by lines 25, 27. The BLbi signal for a set of cells will show a similar distribution of timing curves. Embodiments of the invention detect changes in the dispersion in the performance of a page of cells by measuring or estimating the time to completion (TTC) for the set of cells. Dispersion in the timing of the rising portion of the curves will become differences in time to completion (TTC) for the read operation. It should be noted that FLASH readout circuits typically include features to ensure that normal dispersion in timing performance never produces errors in readout, i.e. the circuits are "sandbagged." Thus, the invention is this disclosure brings to light an aspect of Flash memory that was not appreciated by those practicing the art and uses the phenomenon in novel applications.

The NAND Flash architecture results in different series resistance being presented with the selected cell depending on the different content states in the non-selected memory cells. Hence, NAND Flash memory cell content is queried and compared to different reference levels in sequential steps, where different levels of $V_T$ are queried.

A page of memory cells are read in parallel in a NAND Flash memory, which requires that the read operation be launched by suitable synchronized time signals. The timing signal will equalize the lines of all sense amplifiers for the page, but stronger and weaker cells will drive the sense amplifier lines differently (after equalization) and, therefore, the time from triggering the latches to full voltage development at the output of the sense amps time (i.e. the TTC) will be different for stronger and weaker cells. According to the invention these differences in the time-to-completion (TTC) can be measured and stored in suitable form for further analysis by the system.

Since all memory cells in the NAND Flash matrix are nominally identical, and each one is programmed to a threshold voltage, $V_T$, that produces a predefined current level when queried with an specific voltage level ($V_{READ}$) immediately above their programmed $V_T$, then:

(i) the dispersion in TTC will be a proxy of the dispersion in $V_T$ of the cells being read;

(ii) values of dispersion in TTC at the start of life of a Flash memory page can be saved as a reference value and compared to later measured dispersion at read outs to determine when memory cells degraded beyond a limit that warrants data protection action; and (iii) the knowledge of the dispersion in TTC from each cell in a read operation can be used to assign soft information to each determined memory cell content.

Figure 3:
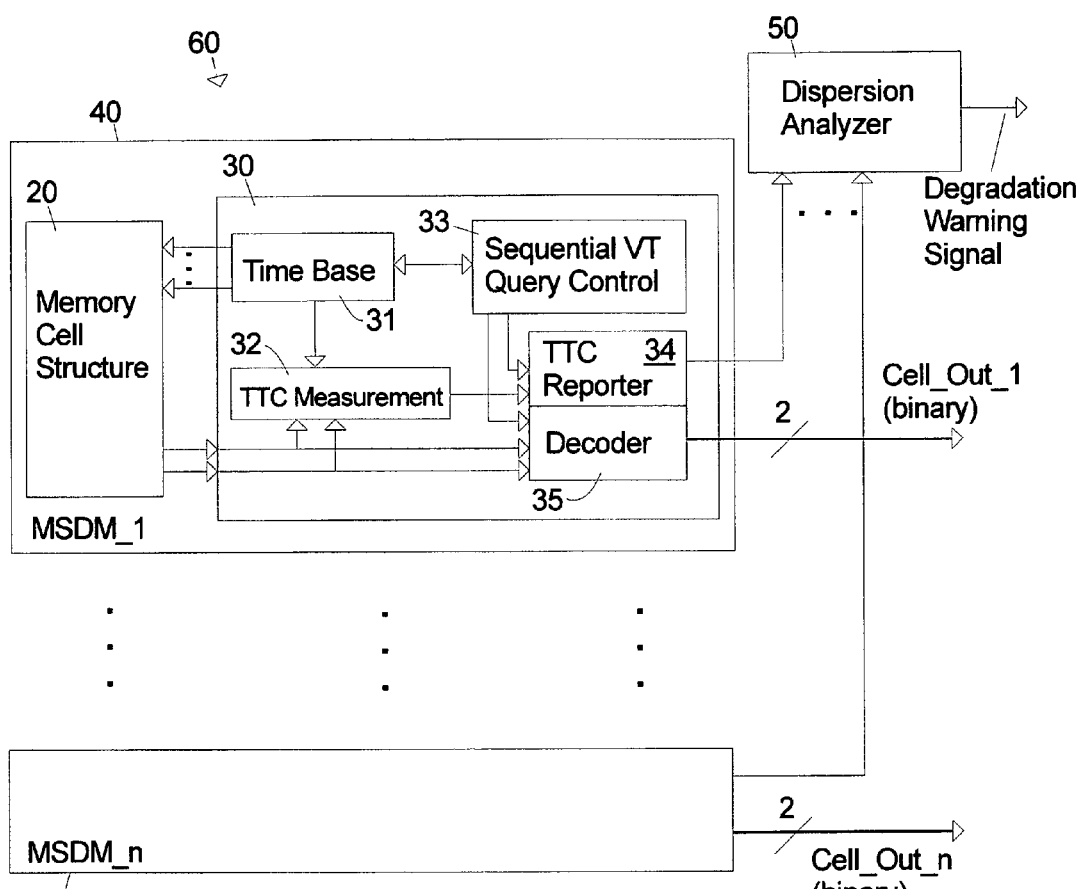
FIG. 3 is an illustration of selected components in a NAND Flash memory page with Early Degradation Detection (EDD) for use in an embodiment of the invention.

FIG. 3 shows selected functional blocks for a NAND Flash page 60 with an Early Degradation Detection (EDD) System according to an embodiment of the invention. The Controller 30 includes Time Base 31, Sequential $V_T$ Query Control 33 and Decoder 35, which are designed according to the prior art and will not be described in detail. The Decoder 35 outputs the corresponding binary code for the memory cell content once the $V_T$ of the memory cell is determined. The Sequential $V_T$ Query Control 33 is an abstraction for the circuits used in the NAND Flash that sequentially searches for the correct $V_T$ in the selected memory cell. Time Base 31 generates the necessary time signals for the pass gates and latches in the sense amplifier and also times the Time-to-Completion (TTC) measurement unit 32.

The Time-to-Completion (TTC) measurement unit 32 measures the time required for the bitlines output driven by a memory cell in the Memory Cell Structure 20 to reach their final values. A Controller 30 and a Memory Cell Structure 20 form a unit which will be called a Memory Structure with Dispersion Measurement (MSDM) unit 40. A page of memory will require multiple MSDMs (MSDM_1 . . . MSDM_n), which are connected in parallel to the Dispersion Analyzer 50. In commercial Flash, Memory Cell Structures are actually implemented in memory arrays with shared circuits without departing from the spirit of this description. FIG. 3 is hence a simplified description constructed to illustrate the concepts of the invention, and is provided for illustration purposes only, not for limiting the invention.

In a sequential read process, the sense amplifier in the Memory Cell Structure will only develop full output in a specific direction when input reference from the dummy bitline (BLbi) are above the $V_T$ of the memory cell under read operation, i.e. being queried. Thus, the content of the selected memory cell will be determined and decoded in binary form. Also at this moment, the proper time-to-completion (TTC), which has been measured by Time-to-Completion measurement unit 32, will reported by the TTC Reporter 34 to the Dispersion Analyzer 50. The TTC Reporter 34 may include buffers and signal conditioning to properly convey the information of time-to-completion to the Dispersion Analyzer.

Figure 4:
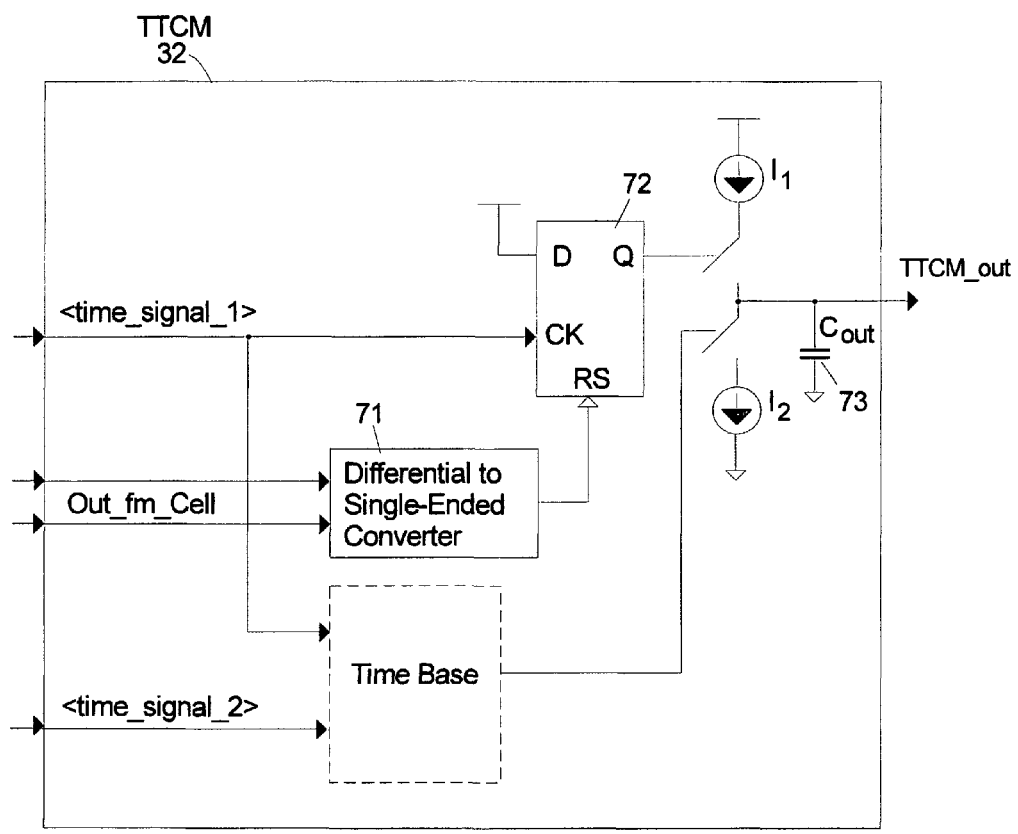
FIG. 4 is an illustration of selected functional design blocks for a time-to-completion measurement unit according to a NAND Flash embodiment of the invention.

An illustration of an embodiment of a Time-to-Completion measurement unit 32 is shown in FIG. 4. This embodiment is similar to charge-pump circuits used in phase detector circuits for Phase-Locked Loop (PLL) systems. In this illustrative realization, but not in any limiting form, the time to completion information is stored in a charge in capacitor $C_{out}$ 73 inside the TTC measurement unit 32. The voltage on the capacitor is proportional to the time that current from current source I1 is allowed to flow into the capacitor through switch S1. Switching of S1 is controlled by flip-flop 72, which is reset by the output from a differential to single-ended converter 71. The differential to single-ended converter 71 uses the two binary outputs from the Memory Cell Structure as input. A correct time to completion is reported to the Dispersion Analyzer (DA) after the $V_T$ of the memory cell is determined. The capacitor 73 is drained through switch S2 and current source I2 based on a signal from the time base.

Figure 5:
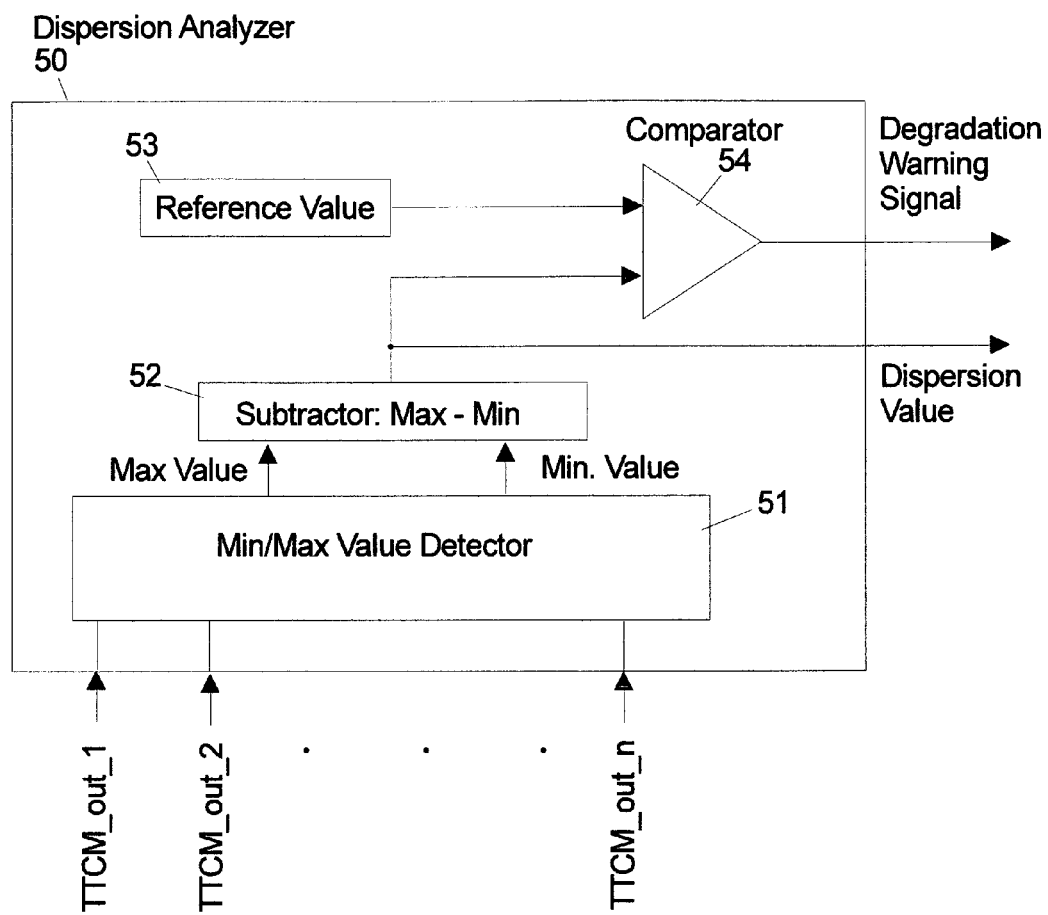
FIG. 5 is an illustration of selected functional design blocks for a Dispersion Analyzer according to a NAND Flash embodiment of the invention.

FIG. 5 is an illustration of selected functional design blocks for a Dispersion Analyzer 50 according to an embodiment of the invention. The Dispersion Analyzer 50 is an analog signal processing block. In this embodiment, its function includes determining the maximum and minimum time of completion from the set of TTC measurement units 32 for a page read operation. Each TTC measurement unit 32 outputs an analog voltage level (TTCM_out) which passes through the TTC Reporter 34 and on to the Dispersion Analyzer 50. The Min/Max Detector 51 in the Dispersion Analyzer determines the maximum voltage and the minimum voltage at its multiple inputs from the TTC Reporters. The difference (delta) between the overall maximum and minimum value is determined as the measure of the dispersion for the page by the Subtractor 52. The Dispersion Analyzer uses Comparator 54 to determine if the computed delta is greater than a Reference Value 53 and sets the warning signal accordingly. The reference value is a pre-determined threshold or an initial value established at the beginning of life of the NAND Flash memory. In an embodiment, at the start of operation of the NAND Flash chip in a storage system, after a program command, a read command is issued to establish the reference value for comparing future dispersion in $V_T$ at each read operation. Thus, the reference value can be set as part of the manufacturing process by having the Dispersion Analyzer compute an initial delta between the overall maximum and minimum value and save that initial delta as the reference value.

Figure 6:
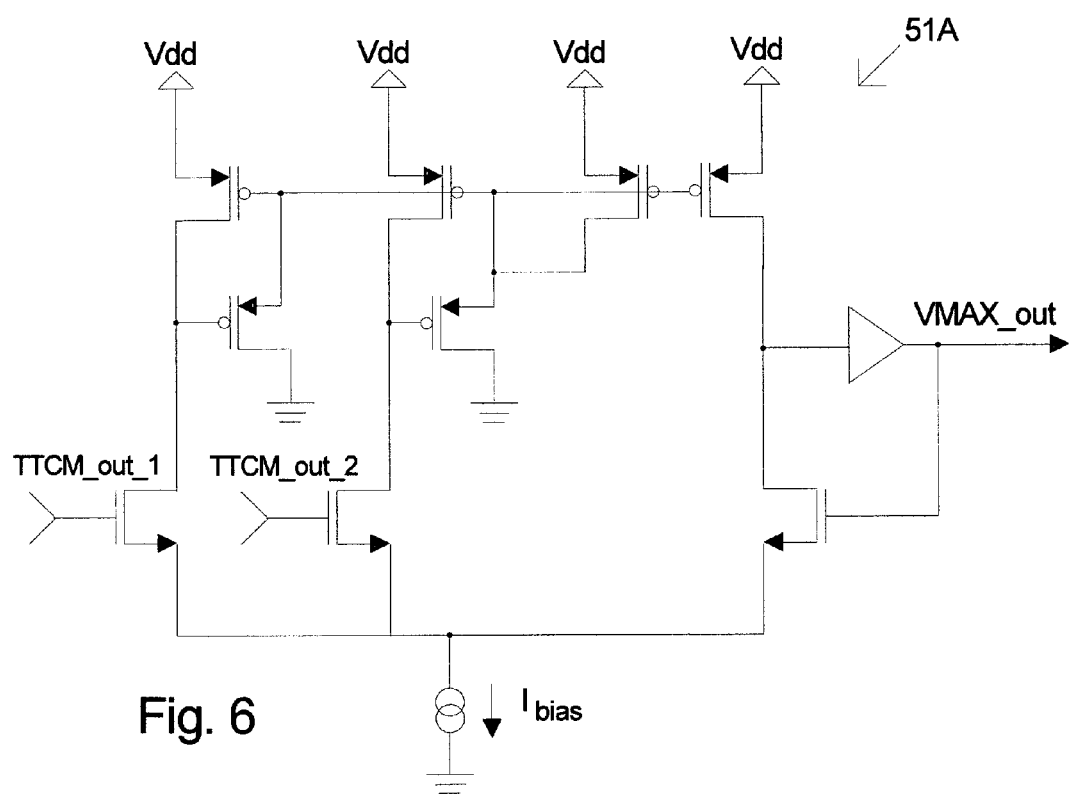
FIG. 6 is an illustration of a design for a maximum voltage detector for use in a Dispersion Analyzer according to an embodiment of the invention.

FIG. 6 is an illustration of a design for a maximum voltage detector 51A for use in a Min/Max Detector 51 dispersion analyzer according to an embodiment of the invention. In FIG. 6, an example of a CMOS circuit for maximum input voltage determination is shown. It is a "winner-takes-all" circuit. The output of this circuit follows the maximum input voltage to the accuracy of 1 mV difference between input levels. The number of inputs in the circuit can be straightforwardly augmented by replication of the circuits, or the two input circuits can be arrayed in a hierarchical tree. In order to follow the minimum input voltage, a suitable change in the inset circuit from NMOS to PMOS is used.

The Early Degradation Detection system can be used to assign probability of error or confidence level of correctness to the content read from each memory cell. Information on the position of the $V_T$ of each cell read by means of information on time-to-completion (TTC) measurement can be used to assign a confidence level of correctness to the data read from each cell. This allows for novel and more efficient encoding and error correction algorithms to be used on NAND Flash chips equipped with such capability to inform position of $V_T$ in an ideal distribution for each cell data read. All requiring a single readout.

NOR Flash Embodiment with Early Degradation Detection

Figure 7A:
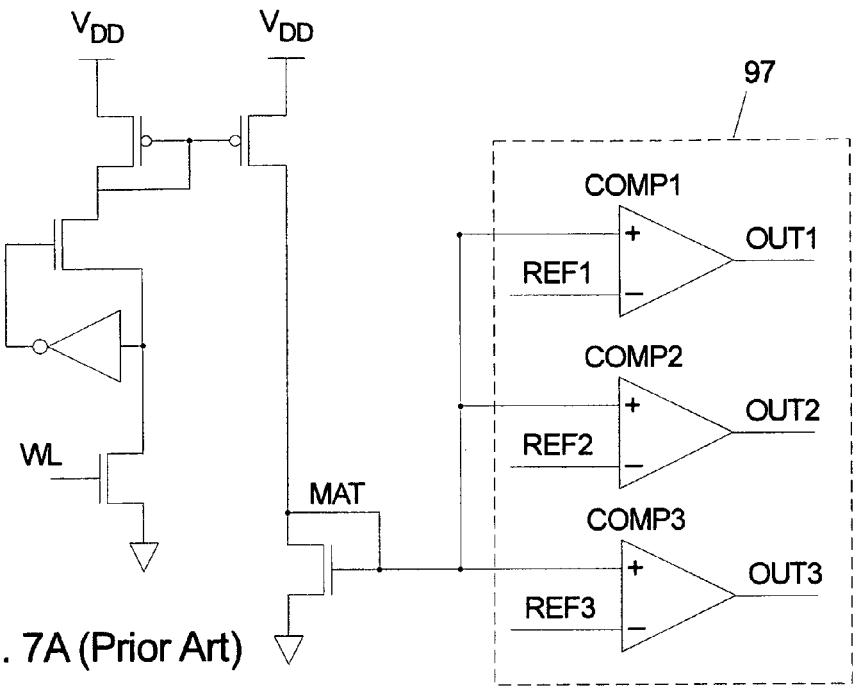
FIGS. 7A and 7B illustrate a prior art multilevel NOR Flash memory with parallel bank of sense amplifiers for fast read out.
Figure 7B:
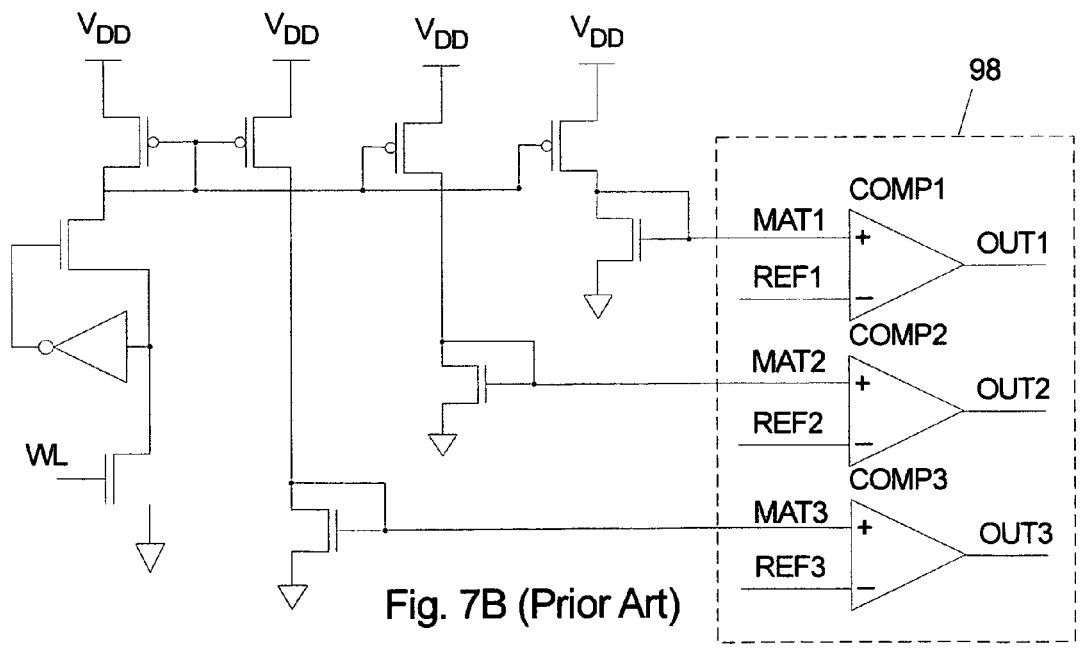

Prior art NOR Flash memory cells and respective sense amplifiers are arranged as indicated in FIGS. 7A and 7B in simplified schematic to highlight fundamental operation. Recall that only column decoder transistors are placed in series with a NOR Flash memory cell and the sensing circuits. Because of that, readout of NOR Flash cells, either single level cells (SLC) or multilevel cells (MLC) can be done in parallel as in an analog-to-digital converter circuit and the $V_T$ programmed in each cell determined in a single query (which is different from the NAND Flash case, where sequential querying is necessary). The comparators COMP1-3 typically use a regenerative loop to develop a small separation of input lines (bit lines MAT1-3, REF1-3) into fully developed output voltage levels. The circuit and timing performance are fairly representative of both single level cell (SLC) and multi-level cell (MLC) readouts.

The prior art multilevel cell (MLC) Flash memory circuits of FIGS. 7A and 7B have been modified to include appropriate reference comparisons (REF1-3) as indicated. The parallel, simultaneous operation of a bank of sense amplifiers 97, 98 (COMP1-3) is used because, as mentioned, only column decoder transistors are in series with the memory cell being read in NOR Flash and proper reference voltages can be defined for determining the threshold voltage of a memory cell under read operation.

The principles of the early detection system for a NOR Flash according to the invention can be explained by observing that:

1) Since several memory cells are read in parallel in a NOR Flash, and this read operation is launched by the same properly defined time signals, which equalize the lines of all sense amplifiers involved in the read operation and trigger the sensing, stronger and weaker cells will separate the sense amplifier lines differently (after equalization) and the time from triggering sensing to full voltage development at the output of the sense amps, which will be referred to as "time to completion" (TTC), will be different for stronger and weaker cells.

2) Since all memory cells in the NOR Flash matrix are nominally identical, and each one is programmed to a threshold voltage, $V_T$, that produces a predetermined current level when queried with an specific voltage level immediately above their programmed $V_T$, then:

(i) the dispersion in time in TTC as defined in (1) will be a proxy for the dispersion in $V_T$ of the cells being read;

(ii) values of dispersion in TTC at the start of life of a Flash memory can be saved and compared to the dispersion in TTC at later read outs to determine when memory cells have degraded beyond a limit that warrants data protection action. A selected value for the dispersion reference value can also be used in place of an actual measured value; and (iii) the knowledge of the dispersion in TTC for all cells in a read operation can be used to assign soft information to each determined memory cell content.

Figure 8:
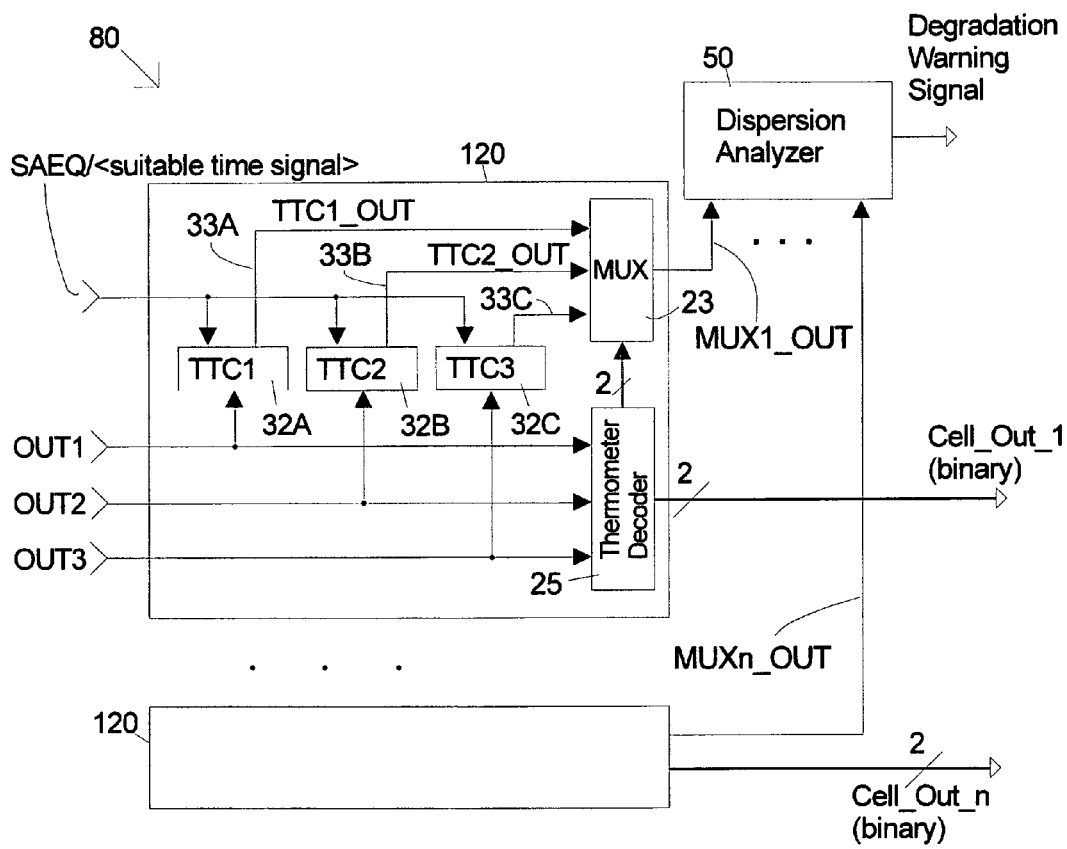
FIG. 8 is an illustration of selected components in a NOR Flash memory system for use in an embodiment of the invention.

FIG. 8 illustrates selected components in a NOR Flash memory 80 with an Early Degradation Detection System according to an embodiment of the invention. The Dispersion Analyzer 50 for the NOR embodiments of the invention is functionally comparable to the Dispersion Analyzer for the NAND embodiments of the invention, but the inputs will be different as described below. Dispersion Analyzer 50 receives input from a plurality (1 . . . n) of TTC Measurement Units 120 which are shown as generating the MUX1_OUT . . . MUXn_OUT signals. A 4-level NOR Flash memory is assumed for the embodiment, but is not a limiting condition. The sense amplifiers 98 will only develop their outputs (OUT1-3) to full positive rail when input references are above the $V_T$ of the memory cell under read operation (MAT1-3). Thus, the three Time-To-Completion (TTC1-3) units 32A-C will develop finite values for time to completion, i.e. finite values for voltages at their output only for those comparisons where $V_{READ}$ is above $V_T$. The other TTC units' blocks will saturate their output at full rail voltage.

The prior art Thermometer Decoder (TD) 25, which outputs the content of the memory cell in binary format in this illustration, also provides the screening signal for the analog multiplexor (MUX) 23 for the proper selection of the voltage representing time-to-completion of the memory cell content to be sent to the Dispersion Analyzer 50. The Dispersion Analyzer 50 will set the degradation warning signal if dispersion of the values in time-to-completion (TTC) for all the cells (or a subset of all the cells) read in a readout operation is larger than a predetermined value.

Figure 10:
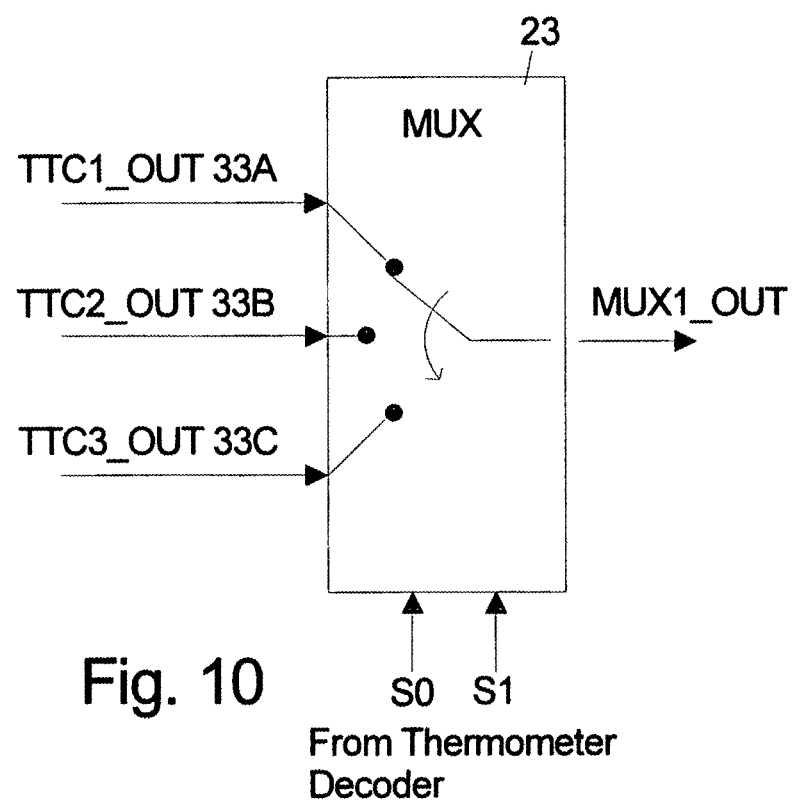
FIG. 10 is an illustration of a design for a multiplexor (MUX) for use in a NOR Flash embodiment of the invention.

FIG. 10 is an illustration of a design for a multiplexor (MUX) 23 an embodiment of the invention. The inputs for the MUX 23 are outputs (TTC1_OUT 33A, TTC2_OUT 33B, TTC3_OUT 33C) from the respective TTC units 32A-C. The MUX selects one of these inputs to pass on to the Dispersion Analyzer as the MUX1_OUT signal. The MUX 23 can be conceptually described as an analog array of pass gates. But several different realizations are possible for the function of transferring the voltage level from the output of one of the three TTC units 32A-C to an input of the Dispersion Analyzer 50, with proper buffers and signal conditioning circuits.

In an embodiment of the NOR Flash readout circuit, the signal from the queried memory cell is compared in parallel against reference replica voltages (REF1-3) corresponding to the different content charge levels the queried memory cell could hold. Depending on design choices, some outputs from the comparators COMP1-3 in this illustration will present value '0' and some the remaining value '1', where '0' and '1' will appear as if in a thermometer scale, i.e., output '0's for instance at OUT2 and OUT3, and output '1' at OUT1, or output '0' at OUT3 and output '1' at OUT1 and OUT2 being two examples of possible outputs.

The Thermometer Decoder 25 will then covert this thermometer scale output to binary coding. In an embodiment, the first of the OUT1-3 signals to hold an output '1' represents the first reference level above the threshold level ($V_T$) of the cell being queried and its position will also be coded into the signal S (s0,s1) from the Thermometer Decoder 25 to be sent to the MUX 23. Signal S is determined by the Thermometer Decoder, which, in an embodiment, works as a thermometer decoder for the memory cell content readout. In a conceptual description, but in no limiting sense, signal S (s0,s1) selects which TTC1-3 signal is the time to completion (TTC) to be reported forward by the MUX to the Dispersion Analyzer.

Figure 9:
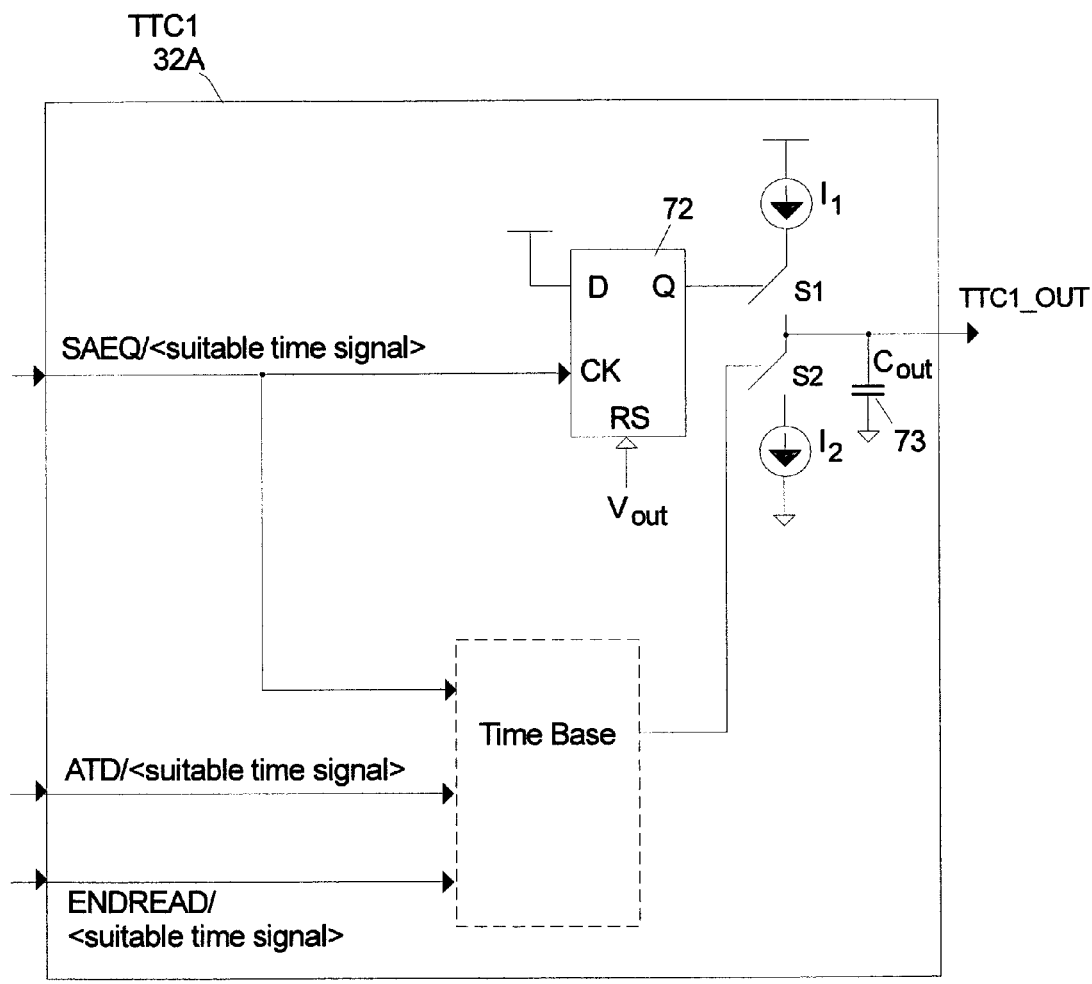
FIG. 9 is an illustration of selected functional design blocks for a time-to-completion measurement unit according to a NOR Flash embodiment of the invention.

The TTC units 32A-C are identical. An exemplary embodiment of the TTC1 unit 32A, which generates output TTC1_OUT, is shown in FIG. 9. It is similar to charge-pump circuits used in Phase-Locked Loop (PLL) circuits, where phase separation between the VCO frequency and a reference frequency is to be determined for corrective action. The time from sense amplifier equalizing (SAEQ) signal rise to $V_{out}$ (OUT1-3 respectively) rise is converted into a voltage level on the capacitor $C_{out}$. Standard timing signals Address Transition Detection (ATD) and ENDREAD or other comparable signals are also used. A buffer circuit (not shown) may be used between the output of the TTC block and the MUX circuits.

In this embodiment, Dispersion Analyzer 50 determines the maximum and minimum time of completion as indicated in the output signals from the plurality of TTC Measurement Units 120 for a page read operation. Each ITC 32A-C outputs an analog voltage level which goes to the MUX 23, which in turn selects one of its three inputs to send on to the Dispersion Analyzer 50. The Min/Max Detector 51 in the Dispersion Analyzer determines the maximum voltage and the minimum voltage at its multiple inputs from the plurality of TTC Measurement Units 120. The difference (delta) between the overall maximum and minimum value is determined as the measure of the dispersion for the page by the Subtractor 52. The output of the Subtractor 52 is the Dispersion Value which is used in embodiments of the invention, which will be further described below. The Dispersion Analyzer uses Comparator 54 to determine if the computed delta is greater than a Reference Value 53 and sets the warning signal accordingly. The Reference Value is a pre-determined threshold or an initial value established at the beginning of life of the Flash memory. In one embodiment, at the start of operation of the Flash chip in a storage system, after a program command, a read command is issued to establish the Reference Value for comparing future dispersion in $V_T$ at each read operation. Thus, the Reference Value can be set as part of the manufacturing process by having the Dispersion Analyzer compute an initial delta between the overall maximum and minimum value and save that initial delta as the Reference Value.

Support for error correcting code schemes where soft information is required, can be developed for an embodiment of the invention by noting the Dispersion Analyzer has information about the time-to-completion from all the cells which were read. Suitable probability of correctness can be assigned to the final binary results from the position of its originating cell in the dispersion of time to completion results. All requiring a single readout.

Probability Estimates for Error Correction Using Disturb-Strengths & Operation History In normal operation, NOR and NAND Flash memory cells are subjected to disturbs that can either add or remove charges from the floating gate. Table 1 below, which is derived from the IEEE Standard 1005—1998, page 97, gives the operation and condition for different disturb conditions and their effect on the charge in the disturbed memory cell. The set of operations in Table 1 will be assumed to be the default list of operations that have the potential to produce disturbs. However, the invention is not limited to any particular set of operations.

TABLE 1

| Acronym | Operating Mode | Electron Transfer Type |
| --- | --- | --- |
| Gate Erase | Program | Loss |
| Gate Program | Program | Gain |
| Drain Erase | Program | Gain |
| Program Disturb | Program | Loss |
| Punch-through Program | Program | Gain |
| Reverse Tunneling Program | Program | Gain |
| Source Erase | Erase | Loss |
| Channel Erase | Erase | Loss |
| Gate Read Erase | Read | Loss |
| Channel Read Program | Read | Gain |
| Soft Program | Read | Gain |

Measuring Disturb-Strengths by Forcing Errors

A method embodying the invention measures the average relative disturb-strength for a set of operations such as all or part of those in listed Table 1. The disturb-strengths should be determined as part of the manufacturing process. The disturb-strengths can be determined by the device by a self-test as will be described below, but it also possible to run the tests on representative sample devices and then supply the disturb-strength matrix as part of the read-only memory to production devices. It is assumed that Flash memory chips used in a particular device are from a given manufacturer using the same chip architecture and device technology and processes, exhibit substantially similar average relative disturb-strength for the different operations. It is possible that the average relative strength for the different disturbs are sufficiently distinct in chips from different manufacturers to allow a customer to decide which Flash memory chip manufacturer's product is the most adequate part for the selected application.

Figure 11:
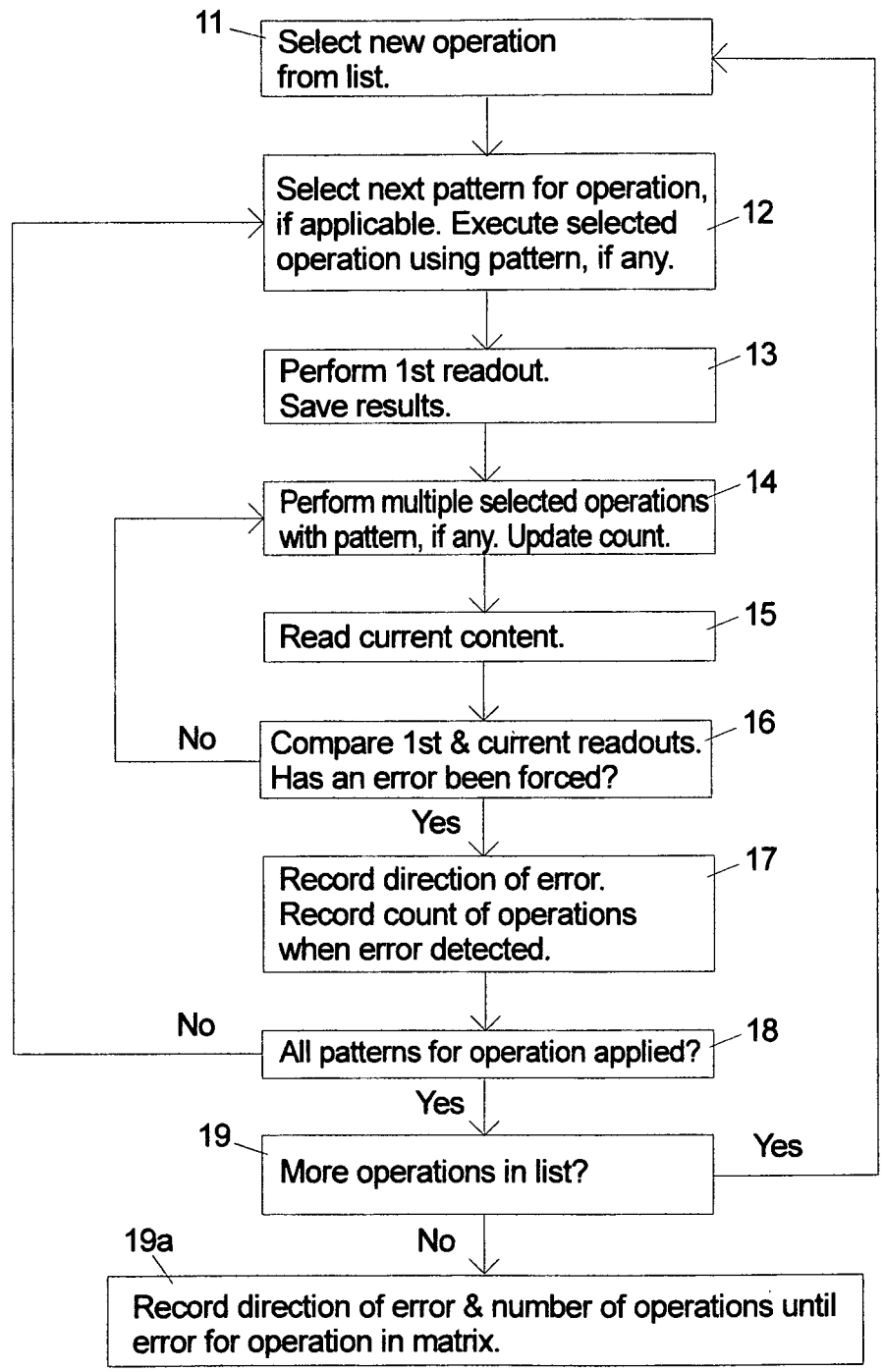
FIG. 11 is a flowchart illustrating of a method according to an embodiment the invention for determining the disturb-strengths of a set of Flash memory operations by forcing an error.

An embodiment of a test and characterization method will be discussed with the aid of the flowchart in FIG. 11. The Flash memory chip should be fully erased or otherwise placed in a consistent, known state before beginning the tests. For illustration purpose, FIG. 11 shows an example of a flow chart for the task of characterizing the average relative disturb-strength of different disturbing operations in a Flash memory chip. The method begins by selecting an operation from the full list of operations that are capable of charge disturbance 11.

Although the method can use any operation from the list, the read operation has some advantages, because, among other reasons, there is no inherent limit on the number of read operations that can be performed. The limits on the number of executions for some operations will be discussed further below. Also unlike some operations the read can be performed without performing other operations in sequence. For example, programming typically requires a preceding erase operation, which is done by block.

Some operations such as erase or read operations may not have any associated data bit pattern, but program operations, for example, can have a corresponding set of bit patterns which are applied in the inner pattern loop of the method. The patterns can be standard memory bit patterns such as AAh or 55h or any other appropriate patterns. Selection of appropriate data patterns can take into account that a memory cell might be more or less susceptible to disturbs depending on the charges presented in the neighbor memory cells. In order to check for this, the system might need to program a cell to, for example, '1', while its neighbors are programmed to '0', and check susceptibility to disturbs. Subsequently, another content is programmed into the selected cell while different contents are programmed into the neighbor cells. When doing the disturb-strength self-test, multiple patterns can be applied, but ultimately in the final disturb-strength matrix there should be a single value for each operation. Although the set of pattern numbers can be used in a number of meaningful ways, including averaging, a conservative approach would select the number for the pattern causing the strongest disturbance. The goal is to have a robust system that warns of impeding problems so that remedial action can be taken.

The selected operation and a selected (first or next) pattern, if any, is executed one time to generate an initial baseline result 12. The initial content of the memory resulting from step 12 is readout and saved for subsequent comparison 13. The memory is then stressed by performing a relatively high number of the selected operations using the current pattern, if any, 14. The total number of times the selected operation has been performed is counted 14. The content of the memory is read again 15. The current content is compared to the initial content to see if an error has been forced yet 16. If the current content still equals the initial content, then more operations are performed by looping back to step 14. Eventually an error will be provoked and the method will proceed to step 17 which records the total number of operations that where executed before the error was detected. Because the memory content is not compared/tested after each operation the resolution is limited by the number of operations that are performed between each readout/test. The direction of the error (gain or loss of charge) is also recorded 17. The result at this point is for the selected operation and possibly one pattern, so any addition patterns for the selected operation are now selected and the inner pattern loop is performed again 18. When all patterns for the selected operation have been executed, if there are more operations in the list the outer loop is executed again 19.

Once all operations have been tested, the recorded data is a matrix of disturb-strengths for each operation 19a. If multiple patterns have been tested for a single operation, the value recorded in the matrix will be a single number selected from or calculated from the set of numbers for the patterns as discussed above. Comparison of the recorded numbers gives the relative disturb-strength for each operation. One possible use for this data matrix is as a tool for differentiating among Flash memory manufacturers as mentioned.

In the case where samples are being tested and destructive testing is permissible an optional embodiment of the method provides for determining changes in the disturb-strengths as the memory undergoes erase/program cycles. In this embodiment the method illustrated in FIG. 11 is re-executed after a selected number of erase program cycles and the whole process repeated a number of times to determine the changes in disturb-strength as a function of the number of erase/program cycles. The changes in disturb-strength would then be analyzed to derive a useful algorithm or set of matrices that could be implemented in production devices to have the disturb-strength matrix track the change as the memory undergoes erase/program cycles over time. As an example, it might be possible to derive an equation that could be used to adjust the disturb-strength matrix as the number of erase/program cycles increases over time.

Some factors need to be considered in determining the number of operations that can be performed without significantly shortening the life of the chip or hitting the end-of-life limit. For any particular Flash memory chip, the manufacturer will specify an upper limit for certain operations. The absolute numbers can be expected to vary as design and fabrication techniques evolve over time. For example, a particular Flash chip might be specified to endure a hundred thousand erase/programming cycles. Therefore, the number of operations that can be performed in disturb-strength testing must be selected with the specific limits of the actual chips being used unless destructive testing is permissible. For devices that are intended to be used after the disturb-strength tests are run, the number of operations should be small compared to the specification limits. An alternative embodiment can perform the disturb-tests on a selected samples of a batch of Flash chips and extrapolate to the behavior of other chips in the batch. It is possible that it may be sufficient to test samples from a generation of chips that all have the same design and fabrication techniques from a manufacturer. When samples are used to determine the disturb-strengths, the disturb-strength matrix will be supplied as read-only data in the program memory of the production data storage device.

Note that in the case of defining the matrix of relative disturb strength from a set of samples from a manufacturer for use with its whole production of the same generation parts, the flow of procedures described in FIG. 11 can be followed to the limit of the Flash chip's usable life. It will be a destructive characterization for the samples used. Such a destructive procedure can be used in addition to the more limited in erase/program cycles version of the procedure used in the device self-testing.

Using Changes in Dispersion to Estimate Disturb-Strength

Charges gained by a memory cell will augment the $V_T$ voltage in that memory cell. Progressive disturbs in the same direction will move the $V_T$ beyond the threshold limit and that cell will be read as containing data corresponding to the next level up in $V_T$ recordable levels. In opposition, charges lost by disturbing events will lower the $V_T$ voltage and progressive disturbs in the same direction will eventually move the $V_T$ to the next level lower in the $V_T$ recordable level range.

In summary, a matrix of relative strength of disturbs can be created with no additional circuit added to the Flash chip. Relative disturbance strength is measured in the number of disturb-events to change the $V_T$ voltage of a target cell beyond threshold values above or below its original recorded $V_T$ value.

It's however clear that once additional circuitry of an EDD based on TTC dispersion is available, the matrix of relative strength of disturbs can be constructed with a smaller number of disturb events and therefore with low cost and shorter time than previously described in this application.

Note that the EDD additional circuitry not only provides information on the total dispersion of the whole set of memory cells queried in a page readout, but also provides information on the relative position of the $V_T$ of each memory cell in the page read. Thus, a matrix of relative strength of disturbs can be constructed based on the number of disturbs to effect a detectable shift in the cell $V_T$ position of a given memory cell, or more precisely, a given change in the TTC block relative to that given cell.

Figure 12:
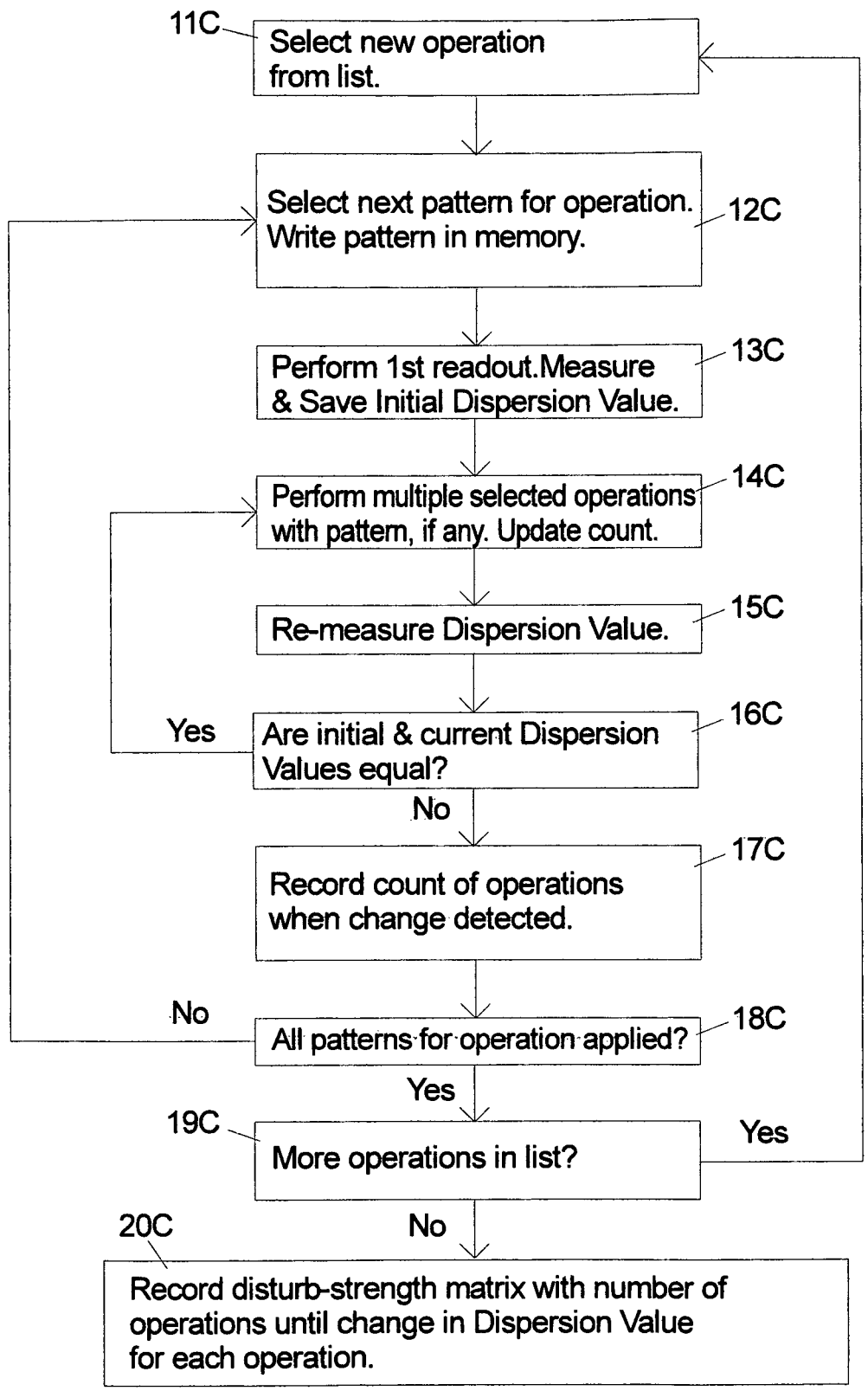
FIG. 12 is a flowchart illustrating of a method according to an embodiment the invention for determining the disturb-strengths of a set of Flash memory operations using dispersion analysis.

In the embodiment which will be described in this section, the system includes the EDD system with dispersion distribution estimation as previously described for NAND or NOR Flash memory. As in the previous embodiment, the disturb-strengths should be determined as part of the manufacturing process. The Dispersion Value signal (shown in FIG. 5) from the Dispersion Analyzer 50 is used in this embodiment. Alternative measures of the $V_T$ distribution can be used with the method as well. The Dispersion Value is an analog signal representing the delta between the maximum and minimum time-to-completion values for a page of memory. The method can be executed on a single page at a time before moving to the next page or the steps can be executed for all pages. In an embodiment, a test and characterization method will start by fully erasing the Flash chip. FIG. 12 shows a flowchart which will be used to describe an embodiment of the method. An operation is selected from the list of operations that are capable of charge disturbance 11C. A bit pattern is selected and written to the memory 12C. A read operation is performed and the initial Dispersion Value generated by the Dispersion Analyzer is saved 13C. The selected operation is repeated a relatively large number of times 14C. The current Dispersion Value is re-measured by performing a read operation 15C. The current Dispersion Value is then compared with the initial Dispersion Value 16C. If the two values are equal (within a tolerance value), then the method loops back to step 14C to perform another batch of the operations and re-measure the Dispersion Value. Once the current Dispersion Value is not equal to the initial Dispersion Value, the count of the operations that were performed to cause the given change in the Dispersion Value is recorded as the disturb-strength of the selected operation 17C. If any other desired patterns exist for this operation, then the method loops back to step 12C to repeat the test for the next pattern 18C. Once all of the patterns for the selected operation have been tested, then the method loops back to step 11C if there are more operations in the list.

A matrix of relative disturb-strengths of the set of operations is then recorded with the above measurements 20C. If multiple patterns have been tested for a single operation, a single value will be recorded in the matrix as discussed above. In the case where samples are being tested and destructive testing is permissible, the method illustrated in FIG. 12, like the method of FIG. 11 as described above, can be re-executed after a selected number of erase program cycles to determine the change in disturb-strength as a function of the number of erase program cycles.

Assigning Probabilities for Data Management Actions

An SSD system 130 according to an embodiment of the invention has a Data Management system 133 that uses the Disturb-Strength Matrix 135 and the Operation History 137 to decide when to perform prophylactic actions such as refreshing or moving data. As mentioned above, it is assumed that the relative strengths of disturbing operations for a selected memory chip from a given manufacturer can be taken as representative of the relative strength of disturb operations for all the parts from the same manufacturer, which use the same chip architecture and technology and manufacturing processes. Thus, in a system according to this embodiment:

(i) a running history of previous operations (program-write, erase, read) executed upon a Flash chip is maintained, i.e. Operation History 137;

(ii) the average relative disturb-strengths and gain-loss direction of different disturbing operation is known in Disturb-Strength Matrix 135; and (iii) the cumulative effect on charges of all the disturbing operations actually executed can be estimated using the disturb-strengths and the gain-loss direction. The gain and loss of charges for various operations will be netted out.

Figure 13A:
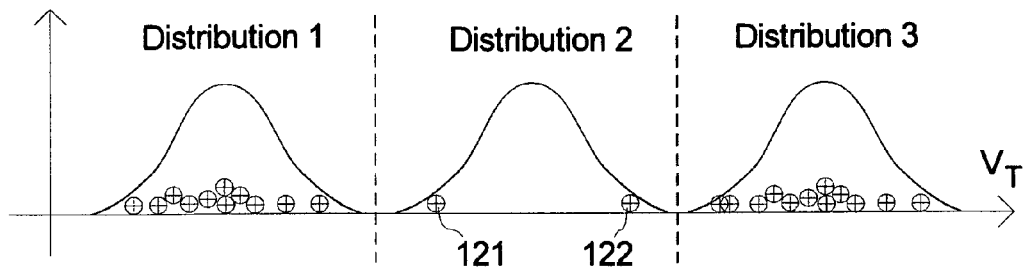
FIG. 13A illustrates a distribution of readout values for Flash memory.

FIG. 13A illustrates a distribution of readout values ($V_T$) for a multilevel Flash memory chip which will be used to explain an embodiment of the invention. In FIG. 13A the various data points have associated probabilities of being correct, i.e. not having been disturbed from the original programmed value, which can be estimated using techniques of the invention. In this example the data points shown in Distributions 1-3 are each within the acceptable range of the original allowable target programmed values for a MLC and, therefore, will be interpreted as being correct by a prior art system. However, due to charge gains or losses, a data point can move from one distribution to another. A readout operation of a prior art Flash memory chip might recover data, for example, at data points 121, 122 as being in Distribution 2, but these data points may have been originally been programmed in Distribution 1 or 3.

Using the history of execution of disturbing operations and relative disturb-strengths of these operations, a probability can be assigned to the correctness of any data point values including 121, 122. Thus, using a method according to the invention, data point value 121 is assigned a probability that it might be the final, disturbed state of a memory cell previously programmed to one of the possible states in Distribution 1, and reached its final state by gaining charge from disturb operations. Similarly, through the effects of operations that can result in loss of charge, the data points initially in Distribution 3 can be shifted to lower values and fall in Distribution 2, e.g. data point 122. The direction and magnitude of the gain or loss of charges is a function of the disturb-strength of specific operations, the gain-loss direction and the cumulative effect of the operations actually executed.

It should be noted the erase operation clears the charges on the memory cells targeted, but this does not require that the history of operations be reset. The erase operation will be added to the history record and will be used to update the cumulative effect of the disturb events that the Flash memory. Note that with erase cycles, relative strength of disturbs might change.

In one embodiment, the history of disturbing operations, can be consolidated as percentages of each disturbing operation in the total number of disturbing operations. This will lead to a weighted sum of the relative strengths of those disturbing operations to the final net disturbing effect in the number of charges in a floating gate. This history of disturbing operations can be recorded by page or sector of the chip, and can also be adjusted to reflect the possible different content of the chip at the time of each disturbing operation.

The disturb-strength matrix and the history of operations can be used in a variety of ways to make decisions about prophylactic actions to protect against data loss. One approach uses conservative decisions to force a refresh or movement of data in the Flash chip. For example, from the disturb-strength tests, the Data Management system might have observed that, for example, 1 million read operations on a given (very sensitive) cell produced a bit disturbance in the memory content read. One embodiment of a device according to the invention could then request or perform a data refresh after 1 million read operations in any of its cells. Alternatively, instead of forcing a refresh, a probability could be assigned selected probability, that the cell just read (after 1 million read operations) might be in error. This information can be sent up to error detection and error correction units as a proxy for the level of confidence it should assign to that read data. Refresh will then be a request under the control of the error detector and error correction units.

Figure 13B:
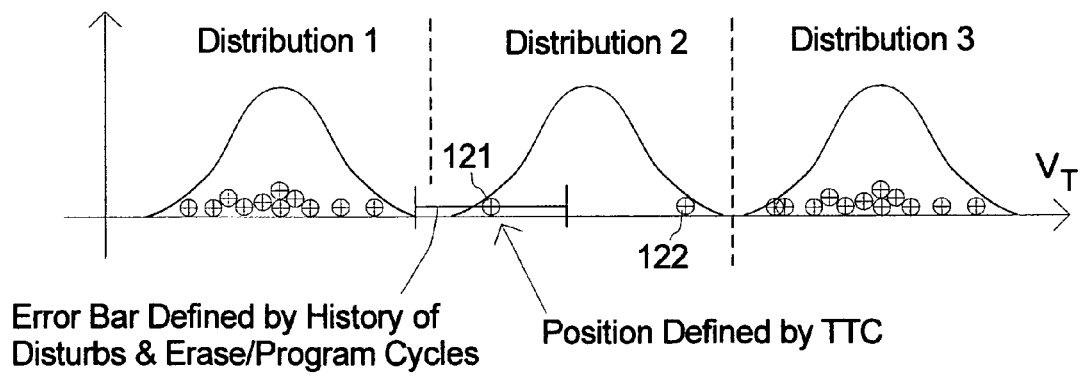
FIG. 13B illustrates a distribution of readout values for Flash memory showing an error bar according to an embodiment of the invention.

In summary, as represented in FIG. 13B, the history of disturbances and erasure cycles can be used to produce an estimation for the error bar over readout data. The TTC information of a particular cell estimates the position of the $V_T$ of that cell on its distribution. Adding these two pieces of information, a management system can assign a probability of error to any data read from Flash memory.

While the present invention has been shown and described with reference to particular embodiments, the invention is limited in scope only as specified in the appended claims.

The invention claimed is:

1. A method of operating a Flash memory system comprising:
recording a running operation history of selected charge-disturbing operations previously executed on the SSD system; and
calculating an estimate of net gain or loss of charges for a memory cell using the operation history, a disturb-strength value for each selected charge-disturbing operation, and a charge gain-loss direction for each selected charge-disturbing operation; and wherein calculating an estimate of net gain or loss of charges for a memory cell further comprises:
calculating percentages for each charge-disturbing operation in the operation history; and
computing a weighted sum of relative strengths of the charge-disturbing operations.

2. A Flash memory system comprising:
a set of Flash memory cells;
a disturb-strength matrix containing a disturb-strength value and a charge gain-loss direction for each selected charge-disturbing operation;
an operation history which is a running record of selected charge-disturbing operations executed by the system; and
a data management unit which uses the disturb-strength matrix along with the operation history to calculate an estimate of net gain or loss of charges for a memory cell; and wherein the data management unit includes means for calculating percentages for each charge-disturbing operation in the operation history; and computing a weighted sum of relative strengths of the charge-disturbing operations.

* * * * *